United States Patent [19]
Imanishi

[11] Patent Number: 6,034,382
[45] Date of Patent: *Mar. 7, 2000

[54] CURRENT-DRIVEN SEMICONDUCTOR DEVICE AND INTEGRATED CIRCUIT

[75] Inventor: Kenji Imanishi, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/728,143

[22] Filed: Oct. 9, 1996

[30] Foreign Application Priority Data

Apr. 26, 1996 [JP] Japan ................................ 8-108098

[51] Int. Cl.⁷ .................. H01L 31/0328; H01L 31/0336; H01L 31/072; H01L 31/109
[52] U.S. Cl. ........................................... 257/197; 257/198
[58] Field of Search ...................... 257/197, 198

[56] References Cited

U.S. PATENT DOCUMENTS

| | | |
|---|---|---|
| 5,031,013 | 7/1991 | Choi . |
| 5,349,202 | 9/1994 | Uemura . |
| 5,489,785 | 2/1996 | Tehrani et al. . |
| 5,569,944 | 10/1996 | Delaney et al. . |

FOREIGN PATENT DOCUMENTS 440139  1/1991  European Pat. Off. .

*Primary Examiner*—Stephen D. Meier
*Attorney, Agent, or Firm*—Armstrong, Westerman, Hattori, McLeland & Naughton

[57] ABSTRACT

A current-driven-type semiconductor device including a substrate, an active part formed on the substrate, and a conductive semiconductor layer formed on the active part as a current path to the active part, wherein the conductive semiconductor layer includes a semiconductor layer having a first conductivity type and a first bandgap, and a semiconductor barrier layer having the first conductivity type and a second bandgap larger than the first bandgap.

7 Claims, 7 Drawing Sheets

CURRENT-DRIVEN SEMICONDUCTOR DEVICE AND INTEGRATED CIRCUIT

BACKGROUND OF THE INVENTION

1. Field of the Invention

The present invention generally relates to semiconductor devices and more particularly to a compound semiconductor device of a current-driven type and an integrated circuit thereof.

2. Description of the Related Art

Group III–V compound semiconductor materials have a general characteristic of a small effective mass of electrons and are used extensively for high speed semiconductor devices such as HEMT (high electron mobility transistor), HET (hot electron transistor), HBT (hetero bipolar transistor), and the like. Further, some of the group III–V compound semiconductor materials have a band structure that cause a direct transition of carriers and are used for optical semiconductor devices such as a laser diode.

Such high-speed compound semiconductor devices include a current-driven-type device, such as an HBT, wherein it is desired to adjust the resistance of the current path. Generally, such an adjustment is achieved easily by inserting an external resistance in the current path. However, use of such an external resistance is cumbersome in the integrated circuit of the semiconductor device. In such a case, it is more preferable to form the resistance inside the layered structure of the semiconductor device as a part of the layered structure.

Figure 1:
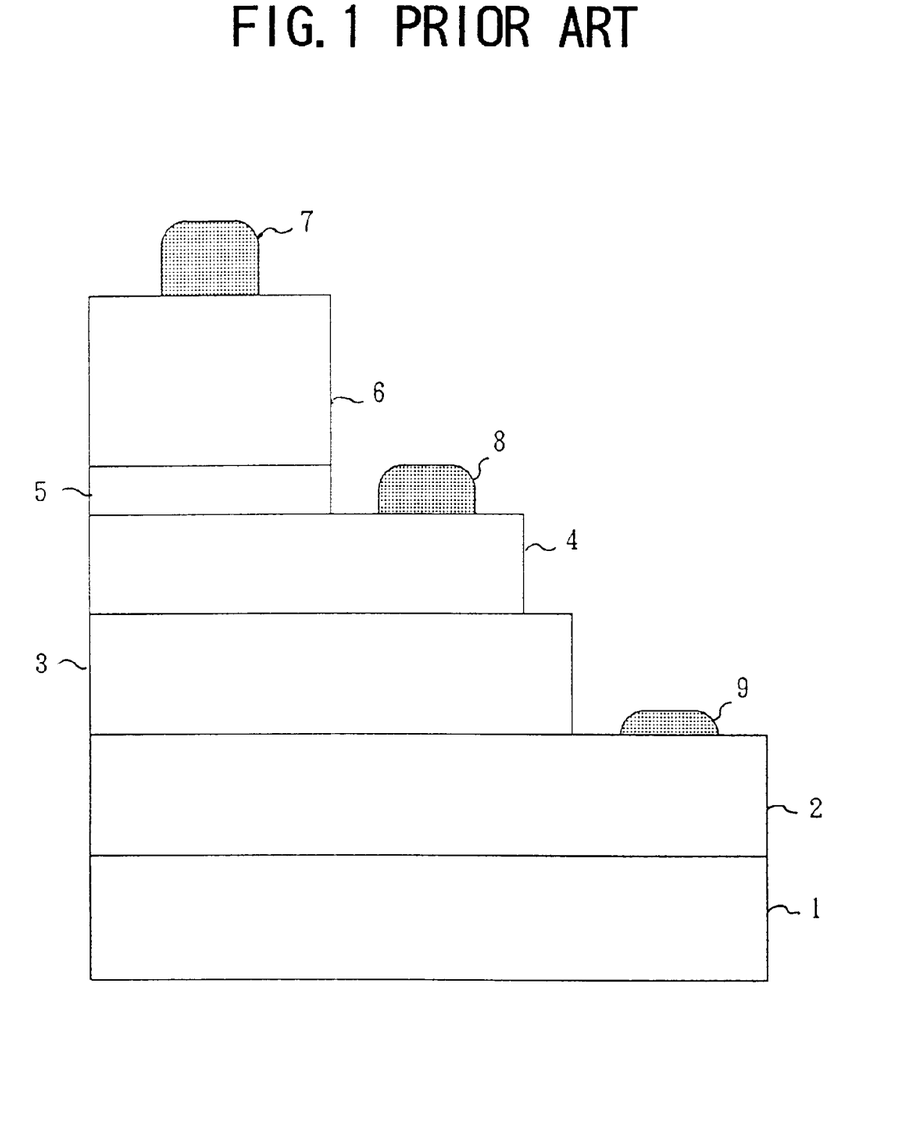
FIG. 1 is a diagram showing the construction of a conventional HBT.

FIG. 1 shows the construction of a typical HBT in a cross-sectional view.

Referring to FIG. 1, the HBT is constructed on a semi-insulating GaAs substrate 1 and includes a collector contact layer 2 of $n^+$-type GaAs formed on the substrate 1, a collector layer 3 of undoped GaAs formed on the collector contact layer 2, a base layer 4 of p-type GaAs formed on the collector layer 3 and an emitter layer 5 of n-type InGaP formed on the base layer 4, wherein there is further provided an emitter contact layer 6 of $n^+$-type GaAs on the emitter layer 5, and an emitter electrode 7 is provided on the emitter contact layer 6 thus formed. Further, a base electrode 8 is provided on an exposed part of the base layer 4, and a collector electrode 9 is provided on an exposed part of the collector contact layer 2.

In the conventional HBT having such a typical construction, it should be noted that the emitter resistance of the device is primarily determined by the thickness, the carrier density and the area of the emitter layer 5 as well as the emitter contact layer 6. Thus, when it is desired to have an emitter resistance different from the emitter resistance of the structure, as in the case of designing a circuit, generally an external resistance in the form of an interconnection pattern has been provided. However, such a use of an external resistance complicates the interconnection pattern and increases the number of fabrication steps. For example, the use of an external resistance may require an extra ion implantation process, and the extra ion implantation process may include an extra mask process. Further, use of such an external resistance may result in a decrease of operational speed due to increased parasitic capacitance and inductance.

SUMMARY OF THE INVENTION

Accordingly, it is a general object of the present invention to provide a novel and useful semiconductor device and an integrated circuit thereof wherein the foregoing problems are eliminated.

Another and more specific object of the present invention is to provide a semiconductor device and an integrated circuit thereof in which a structure for controlling a resistance of a current path is provided in a layered structure of semiconductor layers.

Another object of the present invention is to provide a current-driven-type semiconductor device, comprising:

a substrate;

an active part formed on said substrate; and a conductive semiconductor layer formed on said active part as a current path to said active part;

said conductive semiconductor layer including:

a semiconductor layer having a first conductivity type and a first bandgap; and a semiconductor barrier layer having said first conductivity type and a second bandgap larger than said first bandgap.

Another object of the present invention is to provide a semiconductor integrated circuit device, comprising:

a substrate;

a plurality of active regions formed on said substrate;

and a conductive semiconductor layer formed on said active regions as a current path to said active regions;

said conductive semiconductor layer including:

a semiconductor layer having a first conductivity type and a first bandgap; and a semiconductor barrier layer having said first conductivity type and a second bandgap larger than said first bandgap.

According to the present invention, it is possible to adjust the resistance of the current path by interposing the semiconductor barrier layer in the conductive semiconductor layer. Thereby, the resistance of the current-driven-type semiconductor device is adjusted as desired, without complicating the fabrication process of the device. Further, the problem of parasitic inductance and capacitance associated with the use of an external resistance pattern is successfully avoided.

Other objects and further features of the present invention will become apparent from the following detailed description when read in conjunction with the attached drawings.

DETAILED DESCRIPTION OF THE PREFERRED EMBODIMENTS

Figures 2A, 2B:
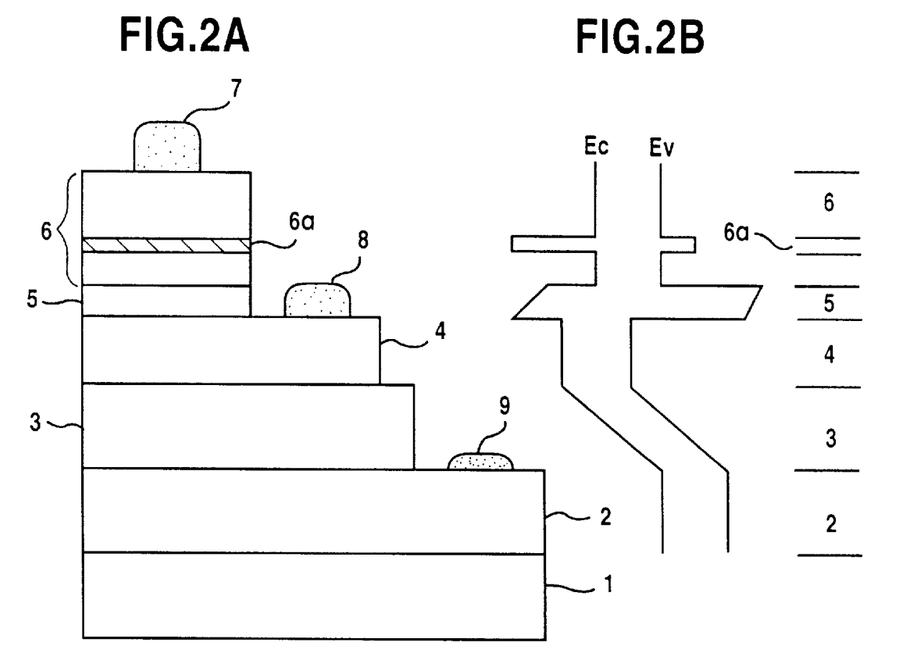
FIGS. 2A and 2B are diagrams showing the principle of the present invention.

First, the principle of the present invention will be explained with reference to FIGS. 2A and 2B respectively showing a structure of an HBT and a band diagram of the same HBT. In FIGS. 2A and 2B, those parts described previously are designated by the same reference numerals and the description thereof will be omitted.

In the present invention, a barrier layer 6a having a large bandgap is interposed in the emitter contact layer 6 that has a smaller bandgap. In FIG. 2B, the conduction band and the valence band are designated respectively by Ec and Ev, as usual in the art.

The barrier layer 6a is doped to a conductivity type identical to the conductivity type of the emitter contact layer 6 and acts as a barrier against the carriers that are injected to the contact layer 6 from the emitter electrode 7. As usual in an HBT, the emitter layer 5 is formed of a semiconductor material having an increased bandgap as compared with the semiconductor material forming the base layer 4.

When a potential barrier exists in the contact layer 6, it should be noted that some of the carriers injected into the contact layer 6 pass through the barrier layer 6a by way of tunneling, while some of the carriers override the potential barrier.

According to the tunnel theory, the probability $T_e^{-1}(E)$ of an electron having an energy E to tunnel through a potential barrier having a barrier height Eb is given according to the relationship of:

$$T_e^{-1}(E)=1+[\{E_b \sin h(d\sqrt{(2mq(E_b-E))})/h\}^2/\{4E(E_b-E)\}].$$

Further, the supply function $f_e(E)$ is given according to the relationship of:

$$f_e(E) = \ln\frac{1 + \exp[q(Ef - E)/kT]}{1 + \exp[q(Ef - E - Va)/kT]},$$

wherein m represents the effective mass of an electron, q represents the elementary electric charge, $E_f$ represents the Fermi level and $E_b$ represents the potential barrier height that acts upon an electron. There holds a relationship $E_b=V_0-E_f$ between $E_b$ and $E_f$, wherein $V_0$ represents the discontinuity of the conduction band $E_c$ at the junction interface between the contact layer 6 and the barrier layer 6a.

In such a case, the electrons tunneling through the barrier layer 6a create a current with a current density Jt given as $$Jt = ATq/k \int_0^{Eb} f_e(E)T_e(E)dE,$$

while the electrons overriding the potential barrier create a current with a current density Jth given as $$Jth = ATq/k \int_{Eb}^{\infty} f_e(E)dE,$$

where A represents the Richardson's constant and T represents the absolute temperature.

Thus, a resistance R given by R=Va/(Jt+Jth) is formed in the contact layer 6 by providing the barrier layer 6a in the contact layer 6, where Va represents the voltage applied across the barrier layer 6a.

Thus, by interposing the barrier layer 6a into the emitter contact layer 6 that forms a part of the current path through the HBT, it is possible to set the emitter resistance of the HBT as desired, without changing the carrier density, layer thickness or the area of the contact layer 6.

Figure 3:
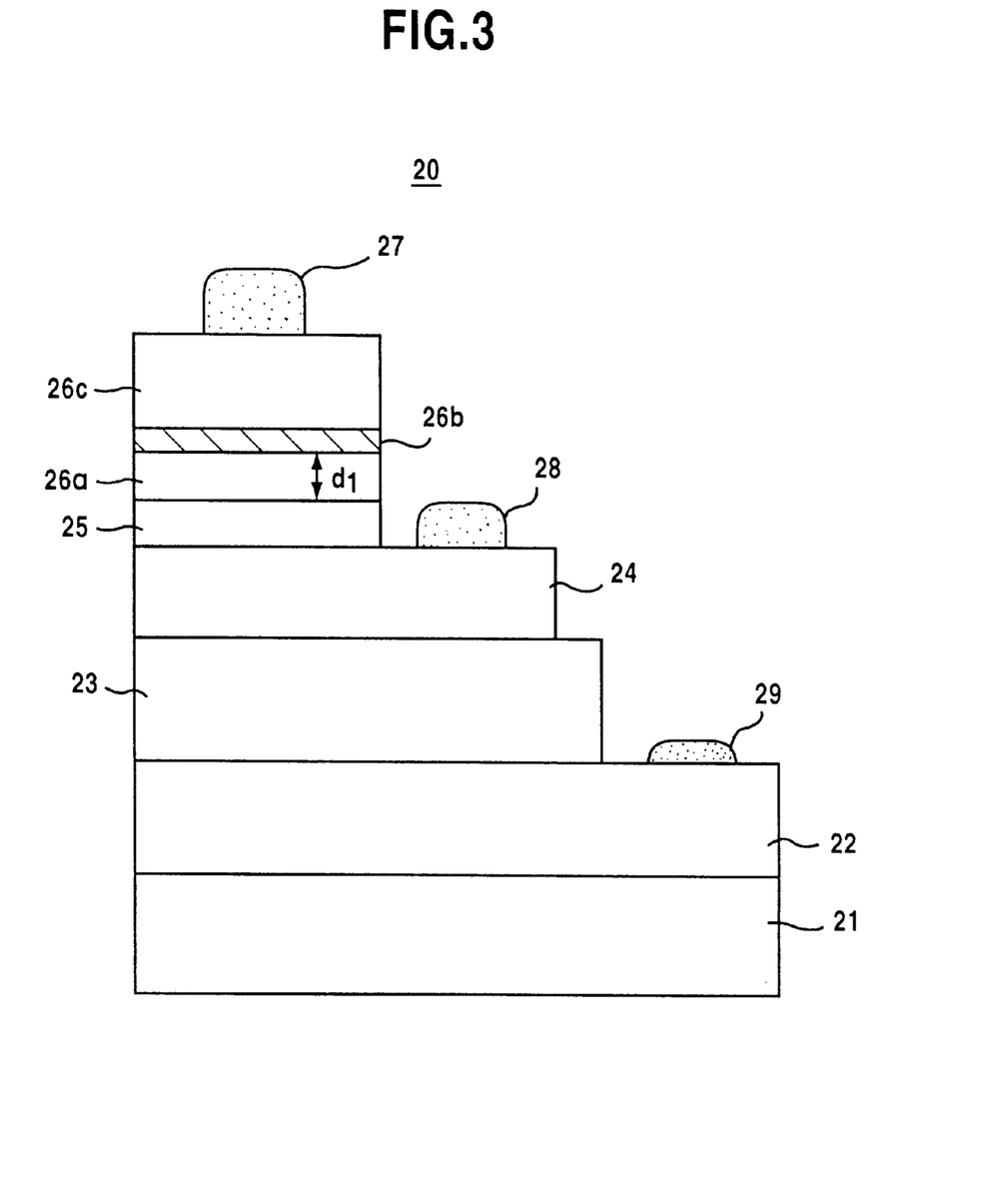
FIG. 3 is a diagram showing the construction of an HBT according to a first embodiment of the present invention.

FIG. 3 shows the construction of an HBT 20 according to a first embodiment of the present invention.

Referring to FIG. 3, the HBT 20 is formed on a semi-insulating GaAs substrate 21 by a MOCVD process. More specifically, a collector contact layer 22 of n-type GaAs is formed on the substrate 21 at a substrate temperature of 650° C. with a thickness of about 0.5 $\mu$m, by supplying TMGa (trimethylgallium) and arsine ($AsH_3$) as respective source gases. During the growth of the layer 22, disilane ($Si_2H_6$) is introduced into a reaction chamber of the MOCVD apparatus as an n-type dopant gas. After the growth of the collector contact layer 22 is completed, a collector layer 23 of undoped GaAs is grown thereon to a thickness of 0.5 $\mu$m similarly to the collector contact layer 22, except that no dopant gas is introduced when growing the collector layer 23.

After the collector layer 23 is thus formed, the dopant gas is switched to the p-type, and a base layer 24 of p-type GaAs is grown on the collector layer 23 to a thickness of about 100 nm. More specifically, $CBr_4$ is used for the p-type dopant gas, and the GaAs base layer 24 is formed with a carrier density of $3\times10^{19}$ $cm^{-3}$.

Further, an emitter layer 25 of n-type InGaP is formed on the base layer 24 formed as such, by supplying TMIn (trimethylindium), TEGa (triethylgallium) and phosphine ($PH_3$) as the source gases, together with a $Si_2H_6$ dopant gas. The emitter layer 25 thus formed may have a thickness of 50 nm and be doped to a carrier density of $4\times10^{17}$ $cm^{-3}$.

In the present embodiment, an emitter contact layer 26a of n-type GaAs is formed further on the emitter layer 25 similarly as before with a thickness $d_1$ typically of about 50 nm, by introducing TMGa and arsine into the reaction chamber together with disilane. After the emitter contact layer 26a is thus formed, a barrier layer 26b of n-type AlGaAs is formed further on the layer 26a with a thickness as desired. The deposition of the barrier layer 26b is conducted similarly to the layer 26a except that TMAl (trimethylaluminum) is added to the foregoing source gases.

After the barrier layer 26b is formed as such, another emitter contact layer 26c of n-type GaAs is formed on the barrier layer 26b, similarly to the case of forming the emitter contact layer 26a. Typically, the contact layers 26a and 26c are doped to the carrier density of $4\times10^{17}$ $cm^{-3}$. The surface part of the emitter contact layer 26c is doped with a further increased carrier density of $4\times10^{18}$ $cm^{-3}$ or more.

After the layered semiconductor structure including the layers 22–26 is formed on the substrate 21, an emitter electrode 27 is formed on the contact layer 26c. Further, a base electrode 28 is formed on a surface of the base layer 24, which is exposed by a mesa etching conducted through the emitter layer 25 as well as through the layers 26a–26c. Similarly, a collector electrode 29 is formed on an exposed surface of the collector contact layer 22, which is exposed by applying a mesa etching through the base layer 24 and the collector layer 23. It is possible to use an alloyed structure of Ti/AuGe/Au or Ti/Pt/Au for the electrodes 27–29.

TABLE I below summarizes the relationship between the thickness as well as the carrier density of the barrier layer 26b and the magnitude of change of the resistance of the emitter contact layer 26, which includes the layers 26a–26c, by providing the barrier layer 26b. In TABLE I, the composition of the barrier layer 26b is set to $Al_{0.26}Ga_{0.74}As$ except for one sample designated by *, in which the composition of the layer 26b is set to $Al_{0.20}Ga_{0.80}As$.

TABLE I

| thickness (nm) | carrier density ($cm^{-3}$) | resistance change (%) |
|---|---|---|
| 6 | $2 \times 10^{18}$ | 100 |
| 4 | $2 \times 10^{18}$ | 107 |
| 6* | $2 \times 10^{18}$ | 33 |
| 6 | $4 \times 10^{17}$ | 2500 |
| 6 | $3 \times 10^{18}$ | 18 |

*$Al_{0.20}Ga_{0.80}As$

As explained already, the resistance of TABLE I is determined by the total of the current tunneling through the barrier layer 26b and the current overriding the barrier layer 26b and changes depending on the thickness and the carrier density of the layer 26b.

For example, it was confirmed that the emitter resistance of the HBT changes from 20 Ω to 4 Ω when setting the size of the emitter electrode 27 to 2×5 $\mu m^2$, by changing the carrier density of the barrier layer 26b from $4 \times 10^{17}$ $cm^{-3}$ to $3 \times 10^{18}$ $cm^{-3}$ while maintaining the thickness of the barrier layer 26b at 6 nm. It should be noted that the foregoing emitter resistance not only includes the contribution from the barrier layer 26b but also the contribution from the emitter contact layers 26a and 26c. In conclusion, it is possible to set the emitter resistance of the HBT of FIG. 3 to a desired value by properly setting the carrier density and thickness of the barrier layer 26b. It is preferred to set the thickness of the barrier layer 26b to be about 3 nm or more but not exceeding 10 nm.

Meanwhile, it was discovered that the emitter resistance decreases in the HBT of FIG. 3 when the thickness $d_1$ of the emitter contact layer 26a is small, typically smaller than 30 nm, even when the carrier density and the thickness for the barrier layer 26b are held the same. For example, the increase of the emitter resistance by forming the barrier layer 26b is limited to be about 9 Ω or less when the barrier layer 26b is formed directly on the emitter layer 25. In such a case, the thickness $d_1$ is zero.

The reason for this phenomenon is interpreted as that, because the emitter layer 25, which is formed of a wide bandgap material, and the barrier layer 26b are disposed so closely to each other, the electrons injected from the emitter contact layer 26c to the emitter layer 25 experience substantially a single potential barrier formed collectively by the barrier layer 26b and the emitter layer 25. Thereby, the barrier layer 26b cannot form an effective resistance.

When the foregoing thickness $d_1$ is set to be larger than about 30 nm corresponding to the de Broglie wavelength of electron, on the other hand, the electrons injected to the emitter contact layer 26c experience both the potential barrier formed by the barrier layer 26b and the potential barrier formed by the emitter layer 25, and the overall emitter resistance of the HBT increases. In other words, it is desirable to set the foregoing thickness $d_1$ to be 30 nm or more in order to achieve an effective adjustment of the emitter resistance by the barrier layer 26b.

Next, an HBT integrated circuit according to a second embodiment of the present invention will be described with reference to FIGS. 4A–4H.

Figure 4A:
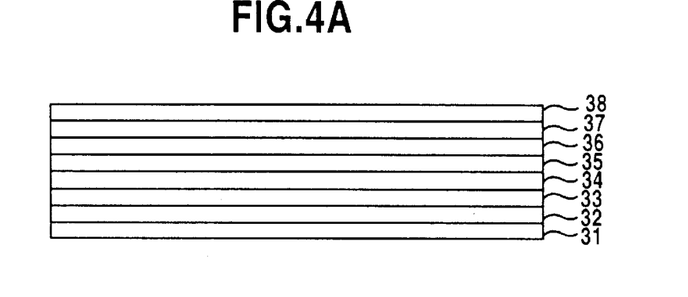
FIGS. 4A–4H are diagrams showing the process of fabricating an integrated circuit device of an HBT according to a second embodiment of the present invention.

Referring to FIG. 4A, semiconductor layers 32–38 are deposited consecutively on a semi-insulating GaAs substrate 31 by an MOCVD process respectively in correspondence to the collector contact layer 22, the collector layer 23, the base layer 24, the emitter layer 25, the first emitter contact layer 26a, the barrier layer 26b and the second emitter contact layer 26c.

Figure 4B:
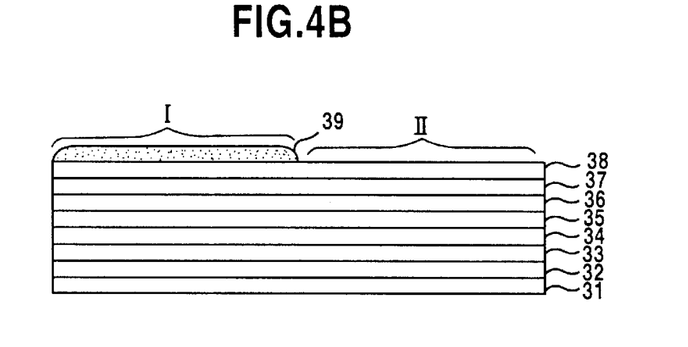
Figure 4C:
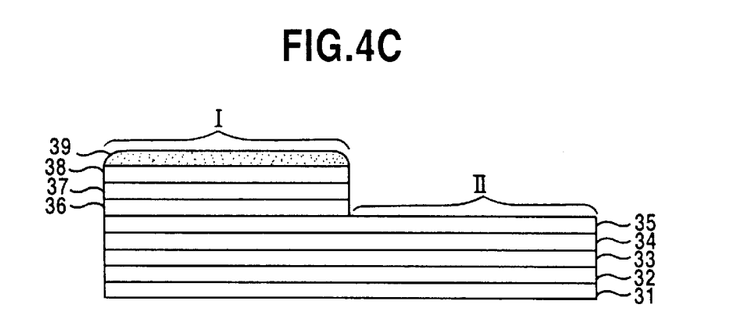

Next, in the step of FIG. 4B, a mask pattern 39 is formed on the layered structure of FIG. 4A so as to cover a region I, and the semiconductor layers 36–38 are removed from an exposed area II by an etching process, while using the mask pattern 39 as a mask, as shown in the step of FIG. 4C.

Figure 4D:
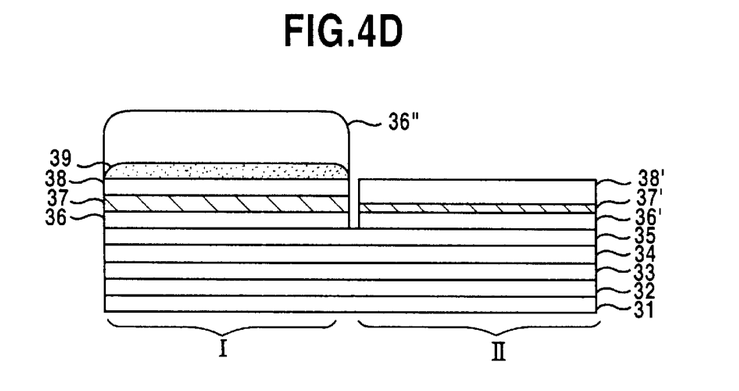

Further, in the step of FIG. 4D, semiconductor layers 36'–38' are deposited on the foregoing region II respectively in correspondence to the first emitter contact layer 26a, the barrier layer 26b and the second emitter contact layer 26c, while retaining the mask pattern 39. Thereby, the barrier layer 37' is formed with a thickness different from the thickness of the barrier layer 37 deposited previously and remaining in the region I. Associated with this, the layers 36' and 38' may be formed with respective thicknesses different from those of the layers 36 and 38 deposited previously. In any event, it is desired that the thicknesses of the layer 36 and the layer 36' be set larger than about 30 nm as explained previously. Associated with the deposition of the layers 36'–38', a layer 36" is formed on the mask pattern 39 covering the region I as indicated in FIG. 4D.

Figure 4E:
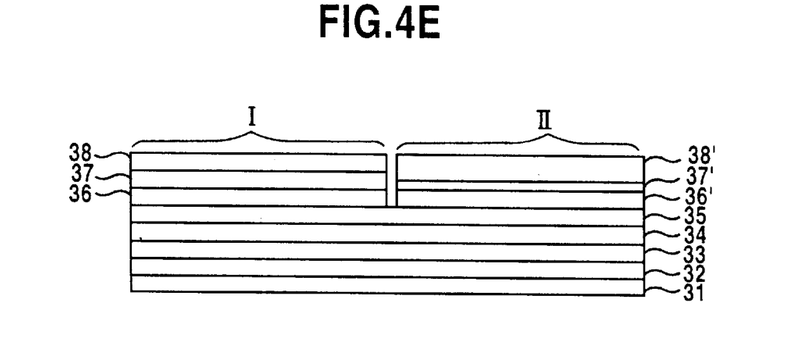

Next, in the step of FIG. 4E, the mask pattern 39 is removed together with the layer 36" thereon and the structure of FIG. 4E is obtained. In the structure thus obtained in FIG. 4E, while it is indicated that the layer 38 in the region I and the layer 38' in the region II form a flush surface, it should be noted that such a limitation is not necessary. Thus, the top surface of the layer 38' may be located above or below the top surface of the layer 38.

Figure 4F:
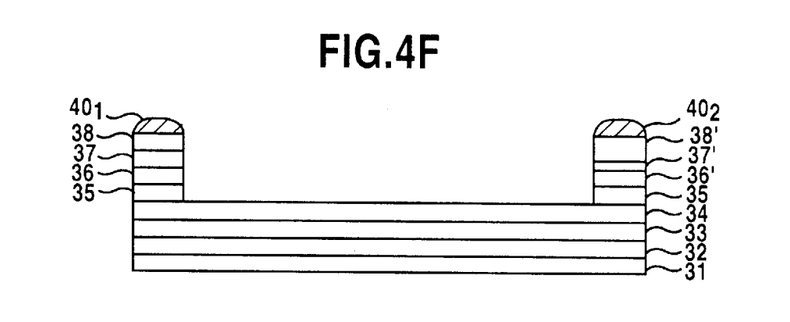

Further, in the step of FIG. 4F, emitter electrodes $40_1$ and $40_2$ are provided respectively on the contact layer 38 and the contact layer 38', and the region between the electrodes $40_1$ and $40_2$ is removed by an etching process conducted while using the electrodes $40_1$ and $40_2$ as a mask, until the base layer 34 is exposed.

Figure 4G:
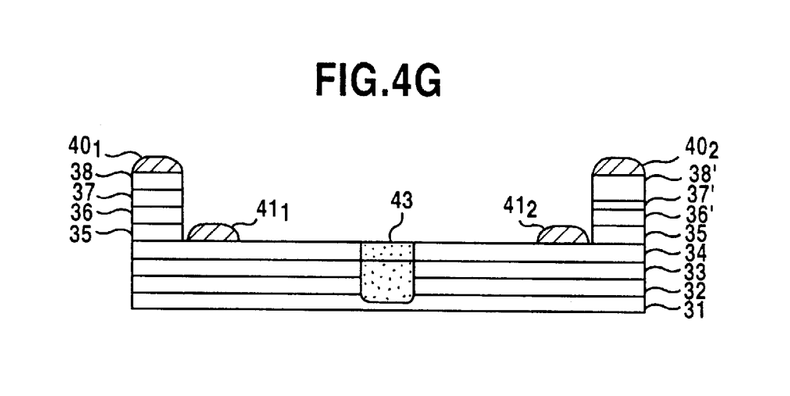

Next, in the step of FIG. 4G, an ion implantation process of proton is conducted into the structure of FIG. 4F at the boundary region between the foregoing region I and the region II, to form an electrically inert isolation region 43, and a base electrode $41_1$ is formed on the exposed surface of the base layer 34 in the region I. Further, another base electrode $41_2$ is formed on the exposed surface of the base layer 34 in the region II.

Figure 4H:
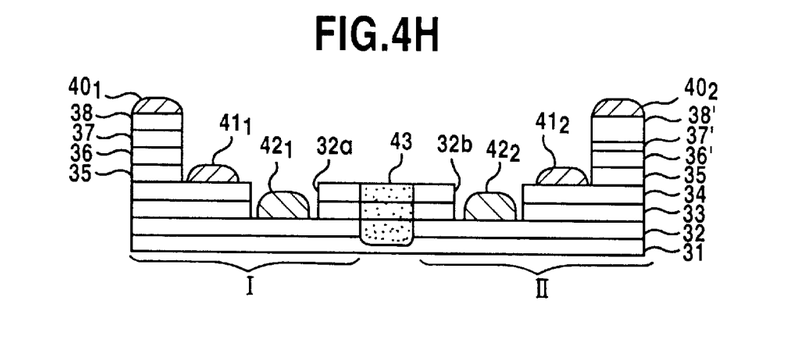

Further, in the step of FIG. 4H, contact holes 32a and 32b are formed respectively in the foregoing regions I and II so as to expose the surface of the collector contact layer 32, and collector electrodes $42_1$ and $42_2$ are formed respectively in the contact holes 32a and 32b in contact with the exposed surface of the collector contact layer 32.

In this way, it is possible to form an HBT integrated circuit on a common semiconductor substrate such that the HBT integrated circuit includes a barrier layer such as the layer 37 or 37' that has a changed thickness and hence the resistance thereof in each of the HBTs on the substrate. Of course, it is possible to form some or all of the HBTs having the same barrier layer thickness and hence the same emitter resistance. In such a case, it is possible to form the regions I and II simultaneously in the same process. Thereby, the fabrication process of the integrated circuit is simplified substantially.

Figures 5A, 5B:
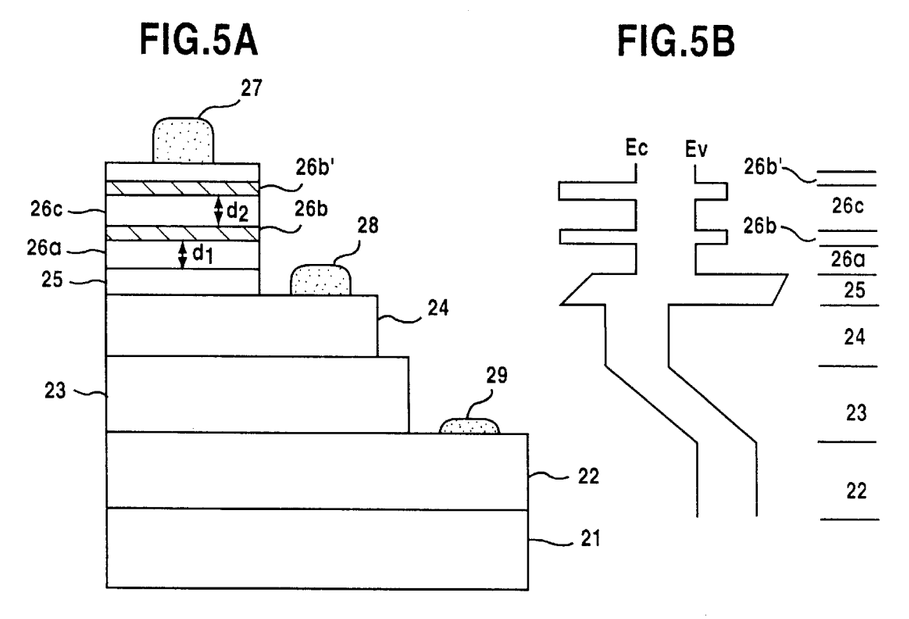
FIGS. 5A and 5B are diagrams respectively showing the construction of an HBT according to a third embodiment of the present invention and a band diagram thereof.

FIGS. 5A and 5B show the construction of an HBT according to a third embodiment of the present invention, wherein those parts described previously are designated by the same reference numerals and the description thereof will be omitted.

Referring to FIGS. 5A and 5B, it should be noted that the HBT of the present embodiment includes a barrier layer 26b' different from the barrier layer 26b in the emitter contact layer 26c at a location separate from the barrier layer 26b by a distance $d_2$.

By securing a distance of 30 nm or more for both the distance $d_1$ and the distance $d_2$, it is possible to increase the number of the potential barriers that act upon the electrons injected into the contact layer 26c, and the emitter resistance of the HBT is increased further.

Next, an edge-emission-type laser diode according to a fourth embodiment of the present invention will be described with reference to FIG. 6. In a laser diode, laser oscillation is induced by injecting a drive current into an active layer therein. The present invention is effective also for adjusting the resistance of the current path of the laser diode.

Figure 6:
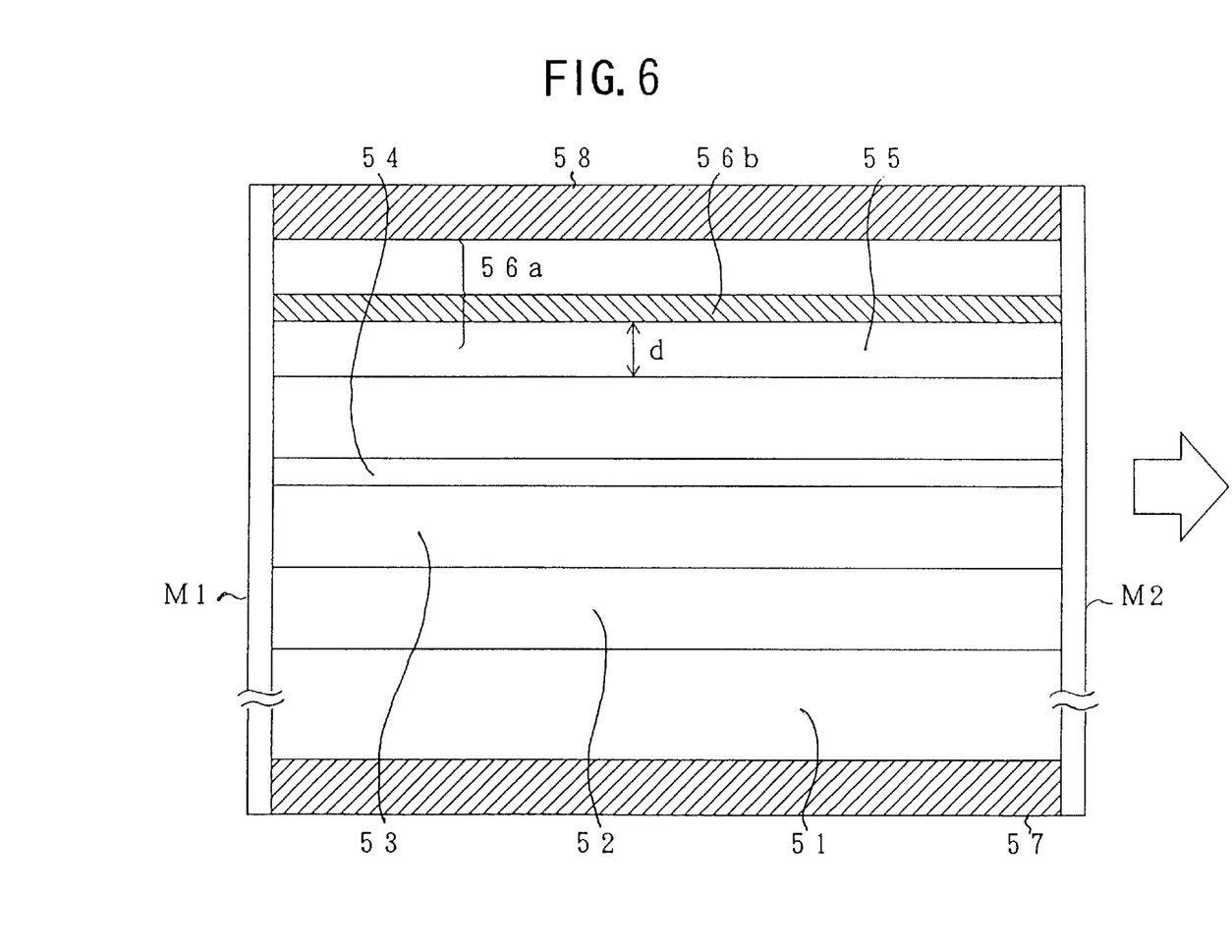
FIG. 6 is a diagram showing the construction of a laser diode according to a fourth embodiment of the present invention.

Referring to FIG. 6, it should be noted that the laser diode is formed on a substrate 51 of n-type GaAs and includes a buffer layer 52 of n-type GaAs formed on the substrate 51, a lower cladding layer 53 of n-type AlGaAs formed on the buffer layer 52, an active layer 54 of undoped GaAs formed on the cladding layer 53, an upper cladding layer 55 of p-type AlGaAs formed on the active layer 54, and a contact layer 56a of p-type GaAs formed on the upper cladding layer 55, wherein the contact layer 56a includes a barrier layer 56b of p-type AlGaAs.

The laser diode further includes a lower electrode 57 on the lower major surface of the substrate 51 and an upper electrode 58 on the contact layer 56a. Further, mirrors $M_1$ and $M_2$ are formed at both longitudinal ends of the layered semiconductor structure on the substrate 51 such that the mirrors $M_1$ and $M_2$ form an optical cavity therebetween.

In the laser diode having such a construction, the electrode 58 injects holes while the electrode 57 injects electrons, wherein the holes injected from the electrode 58 reach the active layer 54 through the contact layer 56a, which includes the foregoing barrier layer 56b, and further through the upper cladding layer 55. On the other hand, the electrons injected from the electrode 57 reach the active layer 54 through the n-type substrate 51, the buffer layer 52 and the lower cladding layer 53.

As usual, the active layer 54 forms a so-called double-heterostructure that accumulates the injected electrons and holes. Thereby, an optical emission occurs as a result of recombination of the electrons and holes thus accumulated in the active layer 54. The optical emission thus caused travels back and forth in the optical cavity formed by the mirrors $M_1$ and $M_2$ and induces a stimulated emission. Thereby a coherent optical beam is produced and amplified in the optical cavity and is emitted outwardly from the optical cavity through a low reflectance mirror such as the mirror $M_2$.

In the laser diode of such a construction, too, it is possible to achieve an effect identical to that obtained by providing a serial resistance to the laser diode, by providing the foregoing barrier layer 56b in the contact layer 56a that forms the current path of the laser diode. In such a construction, too, it is preferable to set the distance d between the cladding layer 55 and the barrier layer 56b to be larger than about 30 nm.

Further, the present invention is by no means limited to an HBT or an edge-emission-type laser diode described previously but is applicable also to a planar laser diode or a DFB (distributed feedback) laser diode, or further to an LED (light-emitting diode) that lacks an optical cavity.

Further, the present invention is by no means limited to the embodiments described heretofore, but various variations and modifications may be made without departing from the scope of the present invention.

What is claimed is:

1. A bipolar transistor, comprising:

a substrate;

a collector layer provided on said substrate, said collector layer having a first conductivity type;

a base layer provided on said collector layer, said base layer having a second, opposite conductivity type;

an emitter layer provided on said base layer, said emitter layer having said first conductivity type;

an emitter contact layer provided on said emitter layer, said emitter contact layer having said first conductivity type; and an ohmic electrode provided on said emitter contact layer;

said emitter contact layer including:

a first layer of said first conductivity type, said first layer having a first bandgap;

a second layer of said first conductivity type, said second layer being provided on said first layer and having a second bandgap larger than said first bandgap, said second layer having a sufficient thickness for allowing tunneling of carriers therethrough; and a third layer of said first conductivity type, said third layer being provided on said second layer and having a third bandgap smaller than said second bandgap.

2. The bipolar transistor as claimed in claim 1, wherein said second layer is disposed with a separation of at least 30 nm from an interface between said emitter layer and said emitter contact layer.

3. The bipolar transistor as claimed in claim 1, wherein said second layer contains carriers with a carrier density in a range of $4 \times 10^{17}$ cm$^{-3}$ to $3 \times 10^{18}$ cm$^{-3}$.

4. The bipolar transistor as claimed in claim 1, wherein said second layer has a thickness of at least 3 nm but not greater than 10 nm.

5. The bipolar transistor as claimed in claim 1, wherein said emitter contact layer further includes a fourth layer of said first conductivity type, said fourth layer being provided on said third layer and having a fourth bandgap larger than said third bandgap, said fourth layer being separated from said second layer by a distance of at least 30 nm.

6. A semiconductor integrated circuit device, comprising:

a substrate; and a plurality of active regions defined on said substrate, each of said active regions comprising:

a collector layer provided on said substrate, said collector layer having a first conductivity type;

a base layer provided on said collector layer, said base layer having a second, opposite conductivity type;

an emitter layer provided on said base layer, said emitter layer having said first conductivity type;

an emitter contact layer provided on said emitter layer, said emitter contact layer having said first conductivity type; and an ohmic electrode provided on said emitter contact layer;

said emitter contact layer including:

a first layer of said first conductivity type, said first layer having a first bandgap;

a second layer of said first conductivity type, said second layer being provided on said first layer and having a second bandgap larger than said first bandgap, said second layer having a sufficient thickness for allowing tunneling of carriers therethrough; and a third layer of said first conductivity type, said third layer being provided on said second layer and having a third bandgap smaller than said second bandgap.

7. A laser diode, comprising:

a substrate having a first conductivity type;

a first cladding layer of said first conductivity type provided on said substrate;

an active layer provided on said first cladding layer;

a second cladding layer of a second, opposite conductivity type provided on said active layer;

a resistance layer provided on said second cladding layer;

a first ohmic electrode provided on said substrate; and a second ohmic electrode provided on said resistance layer, said resistance layer including:

a first layer of said first conductivity type, said first layer having a first bandgap;

a second layer of said first conductivity type, said second layer being provided on said first layer and having a second bandgap larger than said first bandgap, said second layer having a sufficient thickness for allowing tunneling of carriers therethrough; and a third layer of said first conductivity type, said third layer being provided on said second layer and having a third bandgap smaller than said second bandgap.

* * * * *